(12) United States Patent
Kim et al.

(10) Patent No.: US 6,944,554 B2
(45) Date of Patent: Sep. 13, 2005

(54) METHOD FOR DETECTING FAULT ON TRANSMISSION LINES BY USING HARMONICS AND STATE TRANSITION DIAGRAM

(75) Inventors: Chul-Hwan Kim, Gyeonggi-do (KR); Jeong-Yong Heo, Seoul (KR)

(73) Assignee: Sungkyunkwan University, Seoul (KR)

( * ) Notice: Subject to any disclaimer, the term of this patent is extended or adjusted under 35 U.S.C. 154(b) by 0 days.

(21) Appl. No.: 10/731,467

(22) Filed: Dec. 10, 2003

(65) Prior Publication Data

US 2005/0021300 A1 Jan. 27, 2005

(30) Foreign Application Priority Data

Jul. 11, 2003 (KR) .............................. 10-2003-0047071

(51) Int. Cl.[7] ........................... G01R 31/00; H02H 3/42
(52) U.S. Cl. ............................ 702/59; 702/58; 702/64; 702/65; 324/500; 324/512; 361/78; 361/80
(58) Field of Search ............................ 702/57, 58, 59, 702/60, 64, 65, 94, 185; 361/35, 42, 54, 56, 58, 78–80; 714/798–799; 324/500, 512

(56) References Cited

U.S. PATENT DOCUMENTS

| | | | | | |
|---|---|---|---|---|---|
| 5,475,556 | A | * | 12/1995 | Yoon et al. | 361/87 |
| 5,514,978 | A | * | 5/1996 | Koegl et al. | 324/772 |
| 5,537,327 | A | * | 7/1996 | Snow et al. | 700/293 |
| 6,311,307 | B1 | * | 10/2001 | Adamiak et al. | 714/799 |

\* cited by examiner

*Primary Examiner*—Bryan Bui
(74) *Attorney, Agent, or Firm*—Foley & Lardner LLP

(57) ABSTRACT

Disclosed is a method for detecting a fault by using harmonics and a state transition diagram. When the fault occurs on transmission lines, the fault is detected by using harmonics and the state transition diagram. Two logic signals are outputted by using apparent impedance of a steady state characteristic and a sum of harmonics components of a transient state characteristic. Such two logic signals are used as input parameters of the state transition diagram so that the state of an electric power system is presumed based on a state transition of the electric power system. It is possible to prevent a distance relay from being malfunctioned under an increase of load and unstable voltage. The state of the electric power system is presumed by using harmonics and the state transition diagram, and the fault on the transmission line is reliably detected.

11 Claims, 16 Drawing Sheets

METHOD FOR DETECTING FAULT ON TRANSMISSION LINES BY USING HARMONICS AND STATE TRANSITION DIAGRAM

BACKGROUND OF THE INVENTION

1. Field of the Invention

The present invention relates to a method for detecting a fault on transmission lines, and more particularly to a method for precisely detecting a fault on transmission lines by using harmonics and a state transition diagram of an electric power system, in which apparent impedance having steady state characteristic and harmonics having transient state characteristic are used as input parameters of the state transition diagram so as to presume a state of the electric power system, thereby detecting the fault on the transmission lines even if the transmission lines are subject to unstable voltage and overload.

2. Description of the Prior Art

Distance relays use apparent impedance calculated by using voltage and current applied to lines. When a ground fault or a short circuit fault occurs on the lines, a value of apparent impedance of a distance relay is reduced. If apparent impedance having a reduced value enters into a predetermined zone, the fault is determined. FIG. 1 shows a path of apparent impedance when the fault occurs. After the fault occurs, a location of apparent impedance is varied depending on a distance between the distance relay and a fault position. Thus, it is possible to determine the fault and the fault position by using the location of apparent impedance.

Hereinafter, a malfunction of the distance relay will be described. If load of an electric power system is increased on transmission lines, voltage is reduced, current is increased, and apparent impedance calculated by the distance relay is reduced. When load is continuously increased, apparent impedance may enter into a zone. If apparent impedance enters into the zone due to increased load rather than the fault, which is called "load encroachment", the distance relay is malfunctioned. In addition, if voltage is reduced and current is increased due to an unstable state of voltage, apparent impedance may enter into the zone.

Such malfunction of the distance relay is frequently created at an outer portion of the zone, that is, at a third zone shown in FIG. 1.

Conventionally, in order to detect the fault of transmission lines, a trap and a tuner having a radio frequency band are installed at both sides of a transmission line. Then, the fault of the transmission line is detected by using an inhibitatory signal and an operating signal extracted from radio frequency component. However, not only is an additional hardware required to extract the radio frequency component, but also it is difficult to reliably detect the fault by using the radio frequency component.

SUMMARY OF THE INVENTION

Accordingly, the present invention has been made to solve the above-mentioned problems occurring in the prior art, and an object of the present invention is to provide a method for detecting a fault on transmission lines by using harmonics and a state transition diagram, in which two logic signals are outputted by using apparent impedance component of steady state characteristic and a sum of harmonics components of transient state characteristic, and such two logic signals are used as input parameters for the state transition diagram in such a manner that a state transition is generated in the state transition diagram according to a state of a system, thereby presuming the state of the system based on the state transition such that a distance relay is prevented from being malfunctioned even if load applied to the distance relay is increased or unstable voltage is applied to the distance relay.

In order to accomplish this object, there is provided a method for detecting a fault on a transmission line by using harmonics and a state transition diagram, the method comprising the steps of: generating an entry confirmation signal and a critical confirmation signal, in which the entry confirmation signal, which is a signal for notifying whether or not a path of apparent impedance enters into a zone, is outputted from a transmission line by utilizing voltage and current of an electric power system and a sum of harmonics components of the transmission line is calculated so as to output the critical confirmation signal, which is a signal for notifying whether or not the sum of harmonics components exceeds a predetermined critical value; applying the entry confirmation signal and the critical confirmation signal to a state transition diagram in order to make a state transition depending on variation of the entry confirmation signal and the critical confirmation signal; and presuming a state of the electric power system by analyzing the state transition in the state transition diagram according to variation of the entry confirmation signal and the critical confirmation signal, thereby determining a fault, no-fault state, and a load-interruption state, in which apparent impedance enters into the zone due to an increase of load.

According to a preferred embodiment of the present invention, the critical confirmation signal is calculated according to following equations:

$$H_{sum} = \sum_{k=2}^{N/2} |X(k)|$$

$$X(n) = \sum_{k=0}^{N-1} x_k W_N^{nk}$$

$$= \sum_{k=0}^{N-1} x_k \cos\left(\frac{2\pi nk}{N}\right) - j\sum_{k=0}^{N-1} x_k \sin\left(\frac{2\pi nk}{N}\right) \quad (n=0,1,2,\ldots,N-1)$$

wherein, $W_N = e^{-j(2\pi/N)}$, $x_k = x[t-(N-1)+k]$, $X(n)$ is harmonics component and $H_{sum}$ is a sum of harmonics components.

The state transition step of the entry confirmation signal and the critical signal state transition includes the substeps of: shifting into a load-interruption state when apparent impedance enters into a third zone as load increases in relation to an input of the entry confirmation signal and the critical confirmation signal in an initial state, and shifting into a fault proceeding state when the sum of harmonics components exceeds the critical value; maintaining a present state if the entry confirmation signal and the critical confirmation signal are not varied after the state has been shifted into the fault proceeding state, shifting into the initial state if apparent impedance is out of the third zone or the sum of harmonics components becomes lower than the critical value due to a decrease of load, and shifting into a fault state when the sum of harmonics components exceeds the critical value and apparent impedance enters into the third zone due to increase of load; shifting into a circuit breaker trip state for tripping a circuit breaker if a predetermined time is delayed after the state has been shifted into the fault state, maintaining the present state if the entry confirmation signal and the critical confirmation signal are not varied, shifting into the initial state if apparent impedance is out of the third zone due to the decrease of load, and shifting into a fault removing state if the sum of harmonics components exceeds the critical value when load has been increased; and maintaining the present state if the entry confirmation signal and the critical confirmation signal are not varied after the state has been shifted into the fault removing state, and shifting into the fault state if apparent impedance enters into the third zone and the sum of harmonics components becomes lower than the critical value.

According to the present invention, the method further comprises the substeps of: maintaining the present state if the entry confirmation signal and the critical confirmation signal are not varied, shifting into the initial state if apparent impedance is out of the third zone due to the decrease of load, and shifting into a primary load-break and fault state when apparent impedance enters into the third zone due to the increase of load and the sum of harmonics components exceeds the critical value; maintaining the present state if the entry confirmation signal and the critical confirmation signal are not varied after the state has been shifted into the primary load-break or fault state, shifting into the initial state when apparent impedance is out of the third zone due to the decrease of load and the sum of harmonics components becomes lower than the critical value, and selectively shifting into a load-break proceeding state or a secondary load-break or fault state when load is creased; and shifting into the fault state due to a time delay after the state has been shifted into the secondary load-break or fault state, maintaining the present state if the entry confirmation signal and the critical confirmation signal are not varied, and shifting into a load-break proceeding state if apparent impedance is out of the third zone due to the decrease of load and the sum of the harmonics components exceeds the critical value.

According to the preferred embodiment of the present invention, the method further comprises the substeps of maintaining the present state if the entry confirmation signal and the critical confirmation signal are not varied, shifting into the initial state if apparent impedance is out of the third zone due to the decrease of load and the sum of the harmonics components becomes lower than the critical value, and shifting into the fault proceeding state when increased load is continuously maintained.

When a state transition procedure according to the entry confirmation signal and the critical confirmation signal is carried out in a course of the initial state, the fault proceeding state, the fault state, and the circuit break trip state, it is determined that the circuit breaker is tripped under a condition that apparent impedance enters into the third zone of a distance relay while causing the fault and the fault is not removed due to a time delay.

When a state transition procedure according to the entry confirmation signal and the critical confirmation signal is carried out in a course of the initial state, the fault proceeding state, the fault state, the fault removing state, the initial state, or in a course of the initial state, the fault proceeding state, the fault state, and the initial state, it is determined that the fault is removed by means of a main protection under a condition that apparent impedance enters into the third zone of a distance relay, thereby occurring the fault.

When a state transition procedure according to the entry confirmation signal and the critical confirmation signal is carried out in a course of the initial state, the load-interruption state, and the initial state, it is determined that apparent impedance entered into the third zone of the distance relay while increasing load is out of the third zone of the distance relay so that load is decreased.

When a state transition procedure according to the entry confirmation signal and the critical confirmation signal is carried out in a course of the initial state, the load-interruption state, the primary load-break or fault state, the secondary load-break or fault state, and the initial state, it is determined that load is shut off after the fault occurs in a state that apparent impedance enters into the third zone of the distance relay.

When a state transition procedure according to the entry confirmation signal and the critical confirmation signal is carried out in a course of the initial state, the load-interruption state, the primary load-break or fault state, the secondary load-break or fault state, the fault state, and the circuit break trip state, it is determined that the circuit breaker is tripped under a condition that apparent impedance enters into the third zone of a distance relay while increasing load and causing the fault and the fault is not removed due to a time delay.

When a state transition procedure according to the entry confirmation signal and the critical confirmation signal is carried out in a course of the initial state, the fault proceeding state, and the initial state, it is determined that the load is shut off when the fault occurs.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
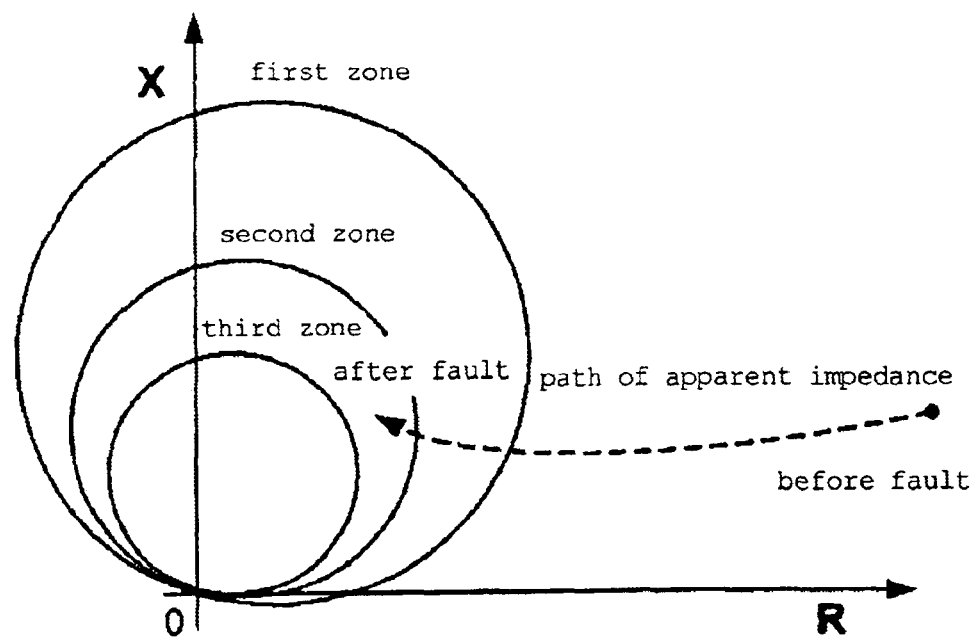
FIG. 1 is a view showing a path of apparent impedance in an impedance plane of a conventional distance relay.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIG. 1 is a view showing a path of apparent impedance in an impedance plane of a conventional distance relay. As shown in FIG. 1, apparent impedance is located out of a zone if a fault does not occur on a transmission line. However, apparent impedance enters into the zone when the fault occurs on the transmission line. The conventional method detects the fault by using apparent impedance entering into the zone.

Apparent impedance accesses to a starting point as a distance between a fault position and a convergence position of apparent impedance is shortened. Since a distance between the starting point and the convergence position of apparent impedance is proportional to the distance between the fault position and the convergence position of apparent impedance, a time for operating a circuit breaker can be adjusted depending on the fault position by dividing the zone on the basis of the starting point.

According to a presently used distance relay, the zone is divided into first to third zones, and delay time of 0, 0.2 and 2 seconds are applied thereto.

Figure 2:
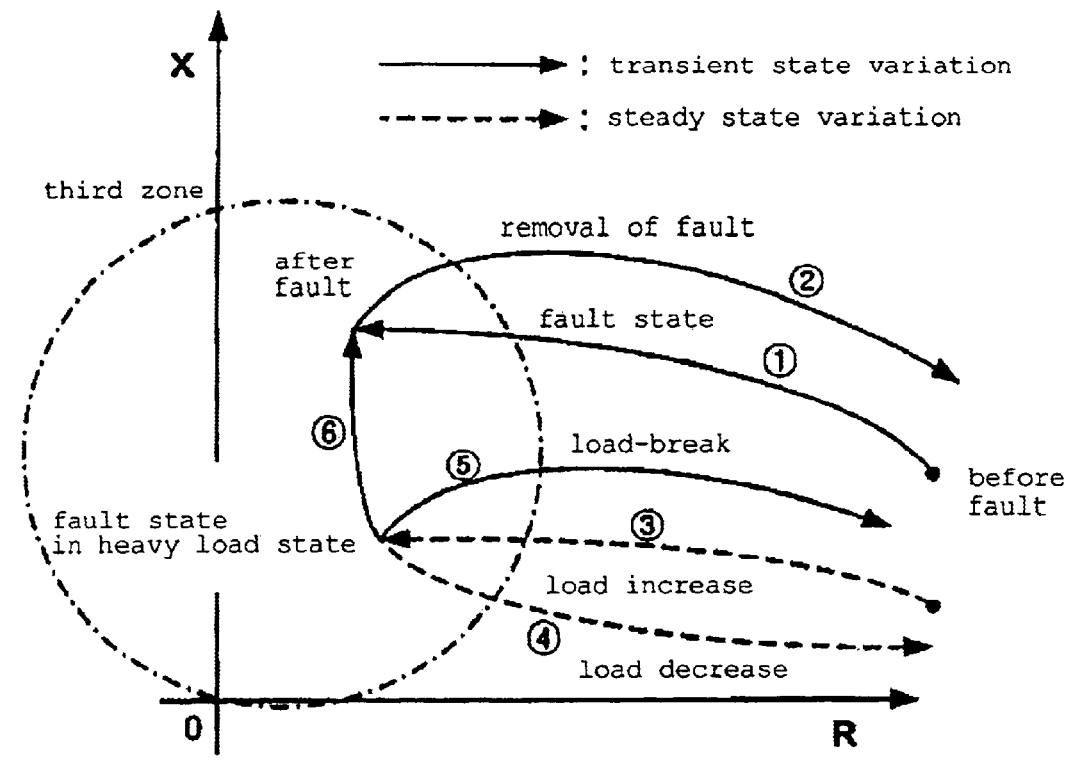
FIG. 2 is a view showing a path of apparent impedance according to a state of an electric power system of a prior art.

FIG. 2 is a view showing a path of apparent impedance according to a state of an electric power system of a prior art. Dotted lines shown in FIG. 2 represent variation of apparent impedance caused by increase or decrease of load in a steady state, in which apparent impedance is gradually varied. In addition, solid lines shown in FIG. 2 represent variation of apparent impedance caused by the fault, removal of the fault, and load-break in a transient state, in which apparent impedance is remarkably varied.

Since great harmonics components are generated during the transient state, it is possible to determine the transient state by detecting harmonics components.

Figure 3:
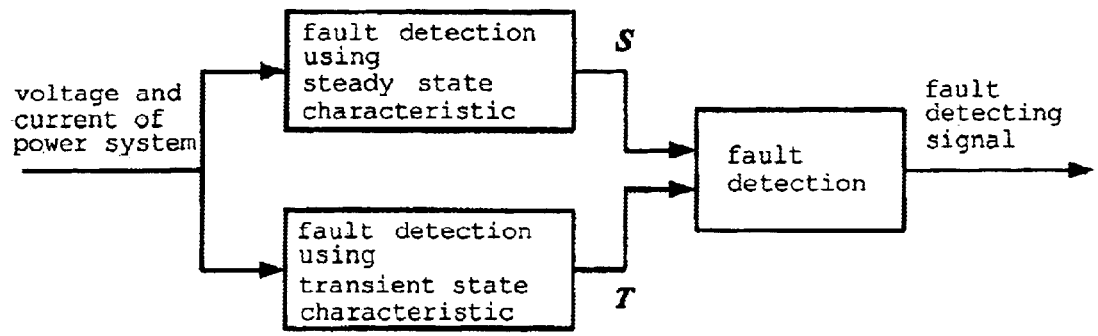
FIG. 3 is a block view showing a fault detecting method according to one embodiment of the present invention.

FIG. 3 is a block view showing a fault detecting method according to one embodiment of the present invention, in which current and voltage are inputted through a potential transformer and current transformer of a transmission line.

In a "fault detection by using steady state characteristic" block, an entry confirmation signal S, which is a logic signal for notifying whether or not apparent impedance enters into the zone, is outputted by detecting apparent impedance and the zone. That is, if apparent impedance enters into the zone, a signal of "1" is outputted. Otherwise, a signal of "0" is outputted.

In a "fault detection by using transient state characteristic" block, a sum of harmonics components is calculated based on following equations 1 and 2.

$$X(n) = \sum_{k=0}^{N-1} x_k W_N^{nk}$$ [Equation 1]

$$= \sum_{k=0}^{N-1} x_k \cos\left(\frac{2\pi nk}{N}\right) -$$

$$j \sum_{k=0}^{N-1} x_k \sin\left(\frac{2\pi nk}{N}\right) \ (n = 0, 1, 2, \ldots, N-1)$$

In the above equation 1, $W_N = e^{-j(2\pi/N)}$, $x_k = x[t-(N-1)+k]$, $X(n)$ is harmonics component.

$$H_{sum} = \sum_{k=2}^{N/2} |X(k)|$$ [Equation 2]

In the above equation 2, and $H_{sum}$ is a sum of harmonics components.

In addition, a critical confirmation signal T, which is a logic signal for notifying whether or not the sum of the harmonics components exceeds a critical value, is outputted. That is, if the sum of the harmonics components exceeds the critical value, a signal of "1" is outputted. Otherwise, a signal of "0" is outputted.

In a "fault detection" block, the logic signals including the entry confirmation signal S and the critical confirmation signal T are used as input parameters of a state transition diagram (referred to FIG. 4), and an output value of the state transition diagram is outputted as a fault detection output signal.

Figure 4:
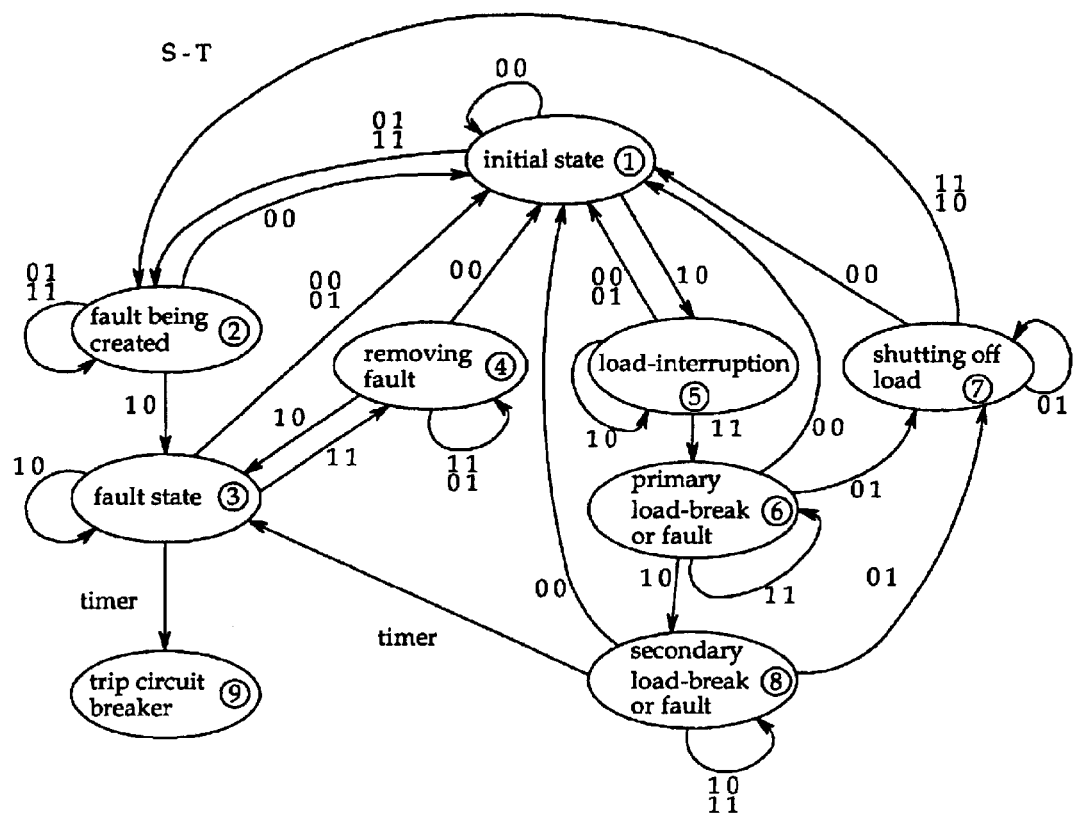
FIG. 4 is a state transition diagram for detecting a fault by using signals S and. T according to one embodiment of the present invention.

FIG. 4 is a state transition diagram for detecting the fault by using the signals S and T according to one embodiment of the present invention. According to FIG. 4, the fault is detected based on the entry confirmation signal S and the critical confirmation signal T used in the "fault detection" block shown in FIG. 3.

The state transition occurs by means of the entry confirmation signal S, which is a fault detection signal using a steady state characteristic and the critical confirmation signal T, which is a fault detection signal using a transient state characteristic.

Table 1 shows the state transition when the fault occurs or load increases.

TABLE 1

| | Case | State transition |
|---|---|---|
| 1 | fault → do not correct fault for 2 seconds | ①-②-③-⑨ |
| 2 | fault → remove fault by main protection | ①-②-③-④-① ①-②-③-① |
| 3 | load increase → load decrease | ①-⑤-① |
| 4 | load increase → load-break | ①-⑤-⑥-⑧-① |
| 5 | load increase → fault occur | ①-⑤-⑥-⑧-③-⑨ |
| 6 | Load-break | ①-②-① |
| ... | ... | |

In Table 1, an initial state is ①. The initial state ① varies depending on the entry confirmation signal S and the critical confirmation signal T of FIG. 3. If a fault state ③ is maintained for a predetermined time, the state is shifted into a circuit breaker trip state ⑨ so as to output a trip signal.

The above table 1 represents variation of state values shown in FIG. 4 depending on cases occurring in the system.

When the fault occurs, the state is shifted into the fault state ③, thereby determining the fault. If the fault state ③ is maintained for 2 seconds, the state is shifted into the circuit breaker trip state ⑨, thereby outputting the circuit breaker trip signal. However, if load-interruption occurs instead of the fault, the state is shifted into a load-interruption state ⑤, thereby determining no-fault.

Figure 5:
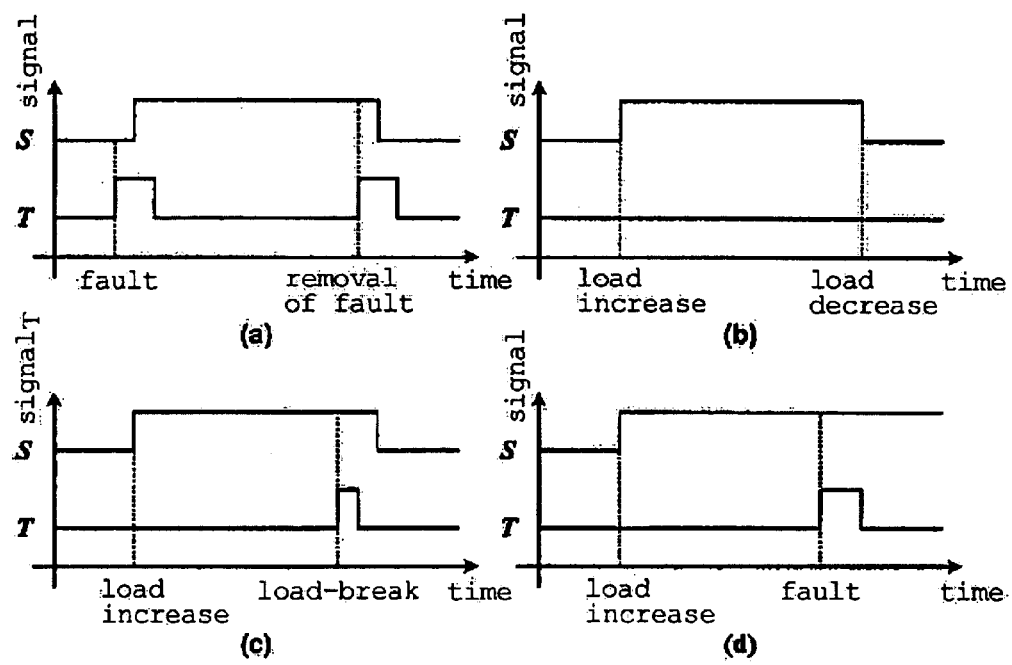
FIG. 5 is a graph showing a variation of signals S and T depending on a state of a system according to one embodiment of the present invention.

FIG. 5 is a graph showing a variation of the signals S and T depending on states of the system according to one embodiment of the present invention. In FIG. 5, (a) represents a variation of the signals S and T from "fault" to "fault removal", (b) represents a variation of the signals S and T from "load increase" to "load decrease", (c) represents a variation of the signals S and T from "load increase" to "load-break", and (d) represents a variation of the signals S and T from "load increase" to "fault".

Referring to (b), (c) and (d) of FIG. 5, when the load-interruption occurs due to an increase of load, the entry confirmation signal S is outputted even if the fault does not occur, so it is difficult to precisely detect the fault by using only the entry confirmation signal S. However, if the critical confirmation signal T is used together with the entry confirmation signal S, the fault is precisely detected.

Figure 6:
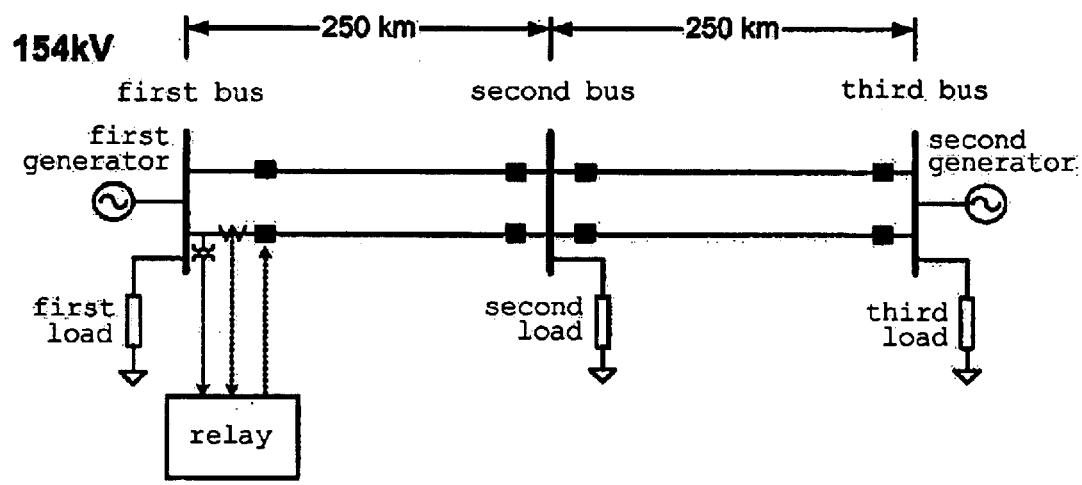
FIG. 6 is a view showing a system at both ends of three buses of 154 kV according to one embodiment of the present invention.

FIG. 6 is a view showing the system at both ends of three buses of 154 kV according to one embodiment of the present invention, in which load is connected to each bus and a relay is connected to a first bus. In addition, an algorithm of the present invention is applied under the conditions that a three-phase fault occurs in a line between a second bus and a third bus corresponding to the third zone, load applied to the second bus is increased, and a load-break occurs.

Figure 7:
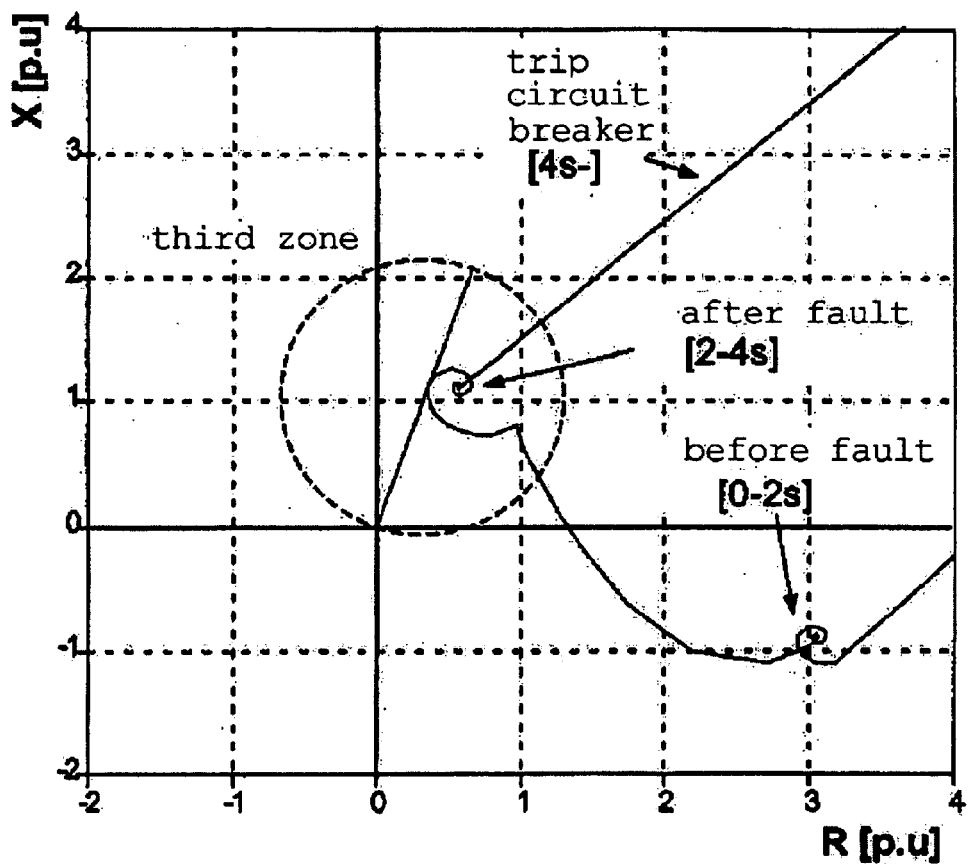
FIG. 7 is a view showing a path of apparent impedance according to one embodiment of the present invention when a 3-phase fault occurs.

FIG. 7 is a view showing a path of apparent impedance according to one embodiment of the present invention when a 3-phase fault occurs. When the 3-phase fault occurs between the second bus and the third bus of FIG. 6, apparent impedance of the relay enters into the zone and the entry conformation signal S of "1" is outputted.

Figure 8:
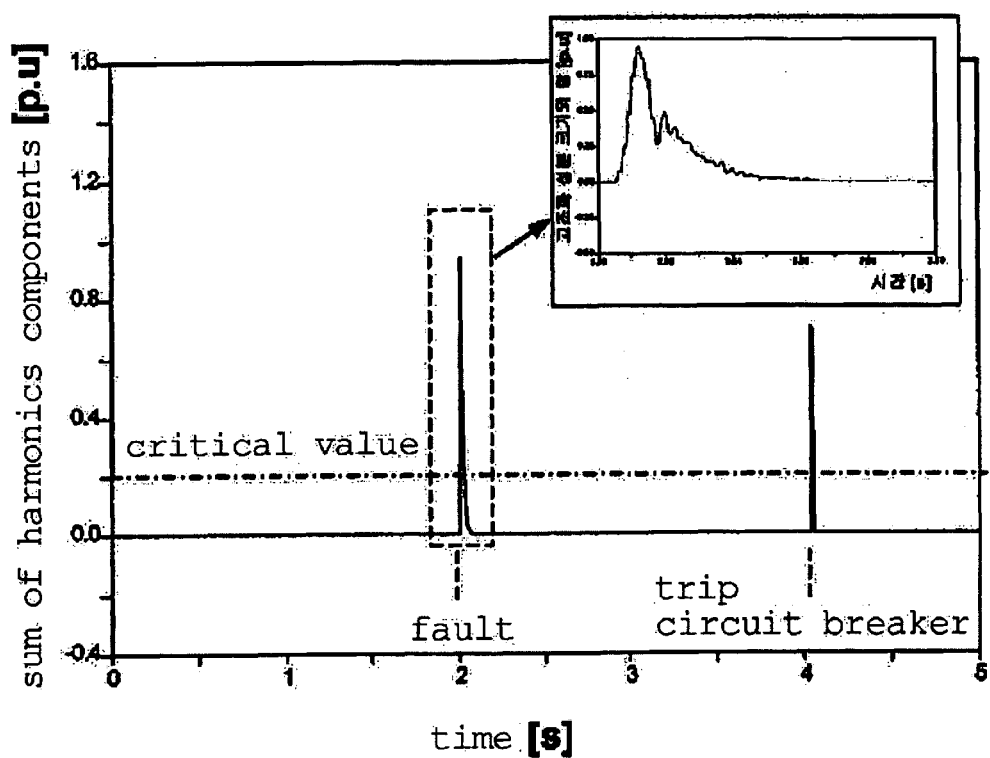
FIG. 8 is a view showing a sum of harmonics components of current according to one embodiment of the present invention when a 3-phase fault occurs.

FIG. 8 is a view showing a sum of harmonics components of current according to one embodiment of the present invention when the 3-phase fault occurs. When the 3-phase fault occurs between the second bus and the third bus of FIG. 6, the sum of harmonics components of current in the relay exceeds a critical value and the critical conformation signal T of "1" is outputted.

Figure 9:
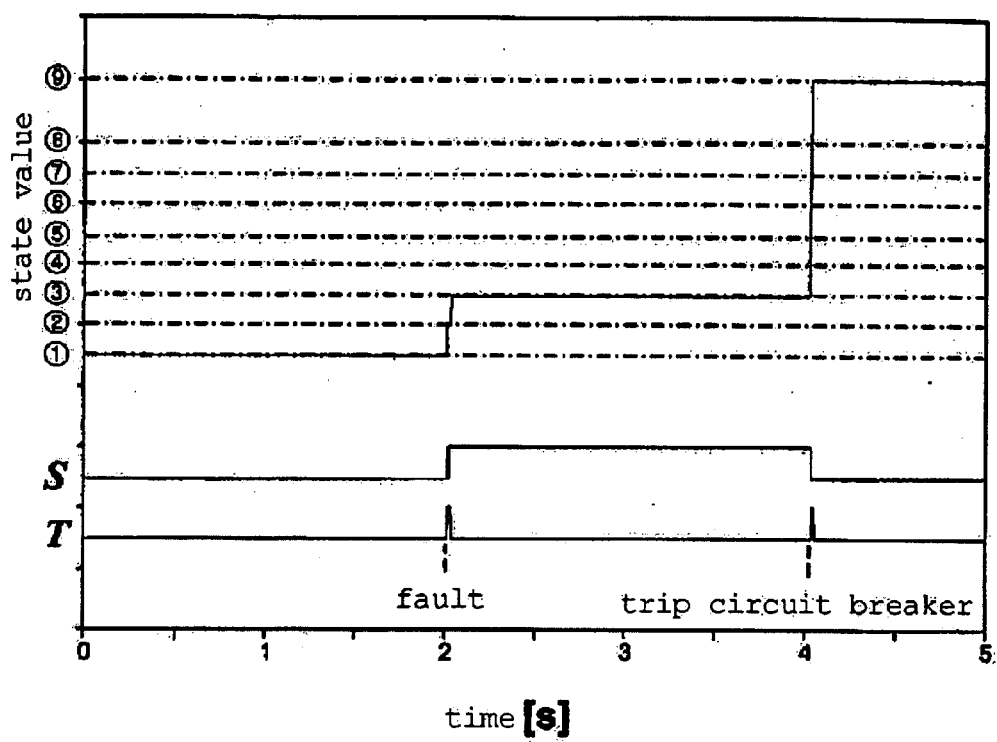
FIG. 9 is a view showing a state value and signals S and T according to one embodiment of the present invention when a 3-phase fault occurs.

FIG. 9 is a view showing a state value and signals S and T according to one embodiment of the present invention when the 3-phase fault occurs. When the 3-phase fault occurs between the second bus and the third bus, the state is shifted in the course of ①–②–③, and is finally shifted into the circuit breaker trip state ⑨.

Figure 10:
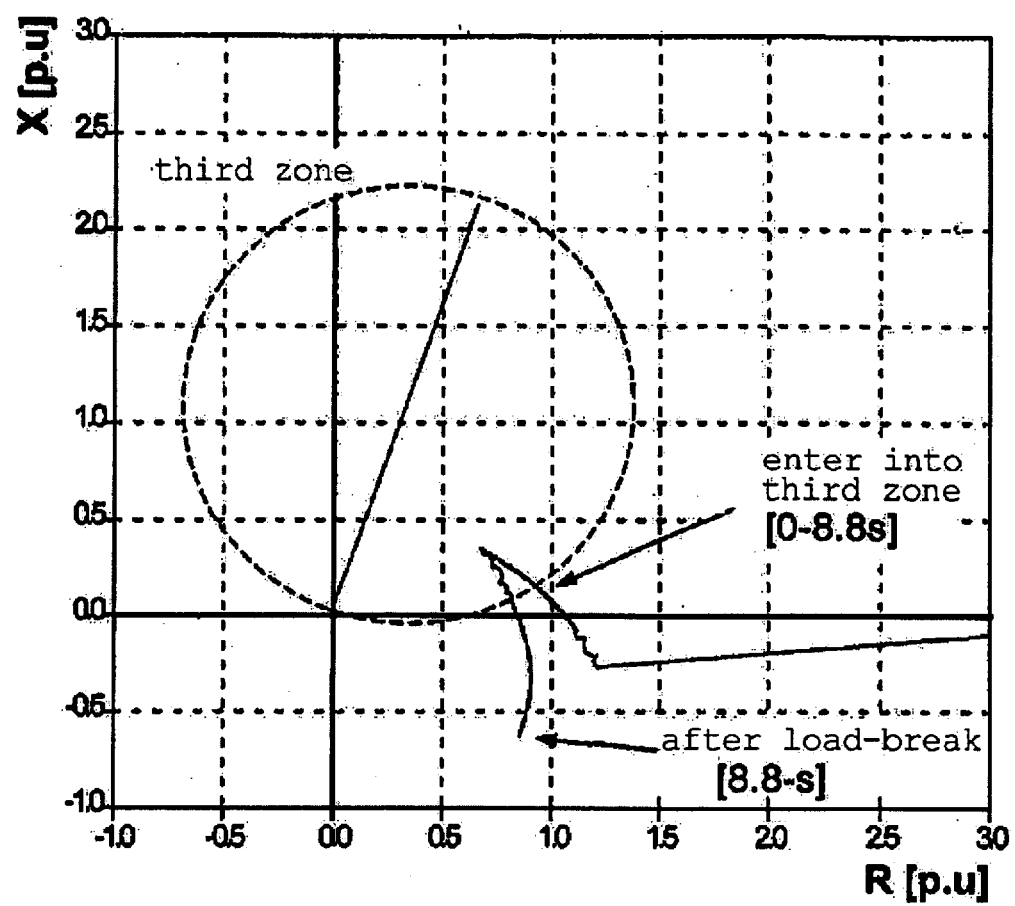
FIG. 10 is a view showing a path of apparent impedance under load-increase and load-break states according to one embodiment of the present invention.

FIG. 10 is a view showing a path of apparent impedance under load-increase and load-break states according to one embodiment of the present invention. If load applied to the second bus is increased, apparent impedance of the relay is gradually reduced and enters into the zone. At this time, the entry confirmation signal S of "1" is outputted. In addition, if load is shut off, apparent impedance is suddenly increased so that apparent impedance is out of the zone. At this time, the entry confirmation signal of "0" is outputted.

Figure 11:
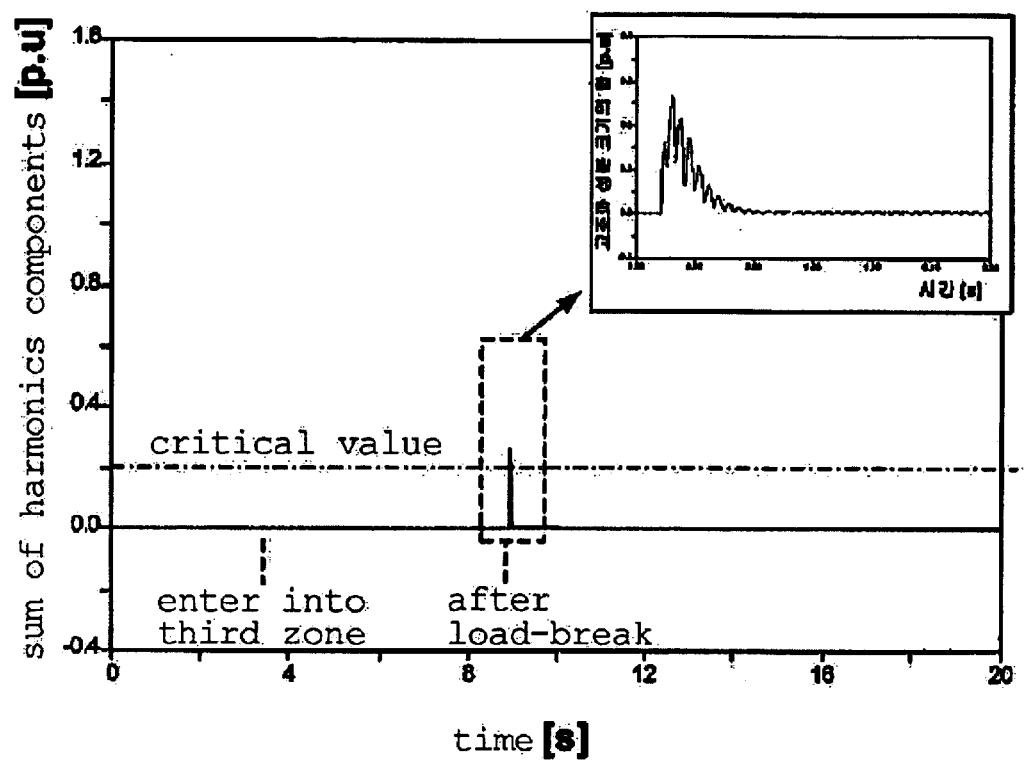
FIG. 11 is a view showing a sum of harmonics components under load-increase and load-break states according to one embodiment of the present invention.

FIG. 11 is a view showing a sum of harmonics components under load-increase and load-break states according to one embodiment of the present invention. When load applied to the second bus is increased, the sum of harmonics components of current in the relay is substantially zero, so the critical confirmation signal T is maintained in "0". However, in the load-break state, the sum of harmonics components exceeds the critical value so that the critical confirmation signal T of "1" is outputted.

Figure 12:
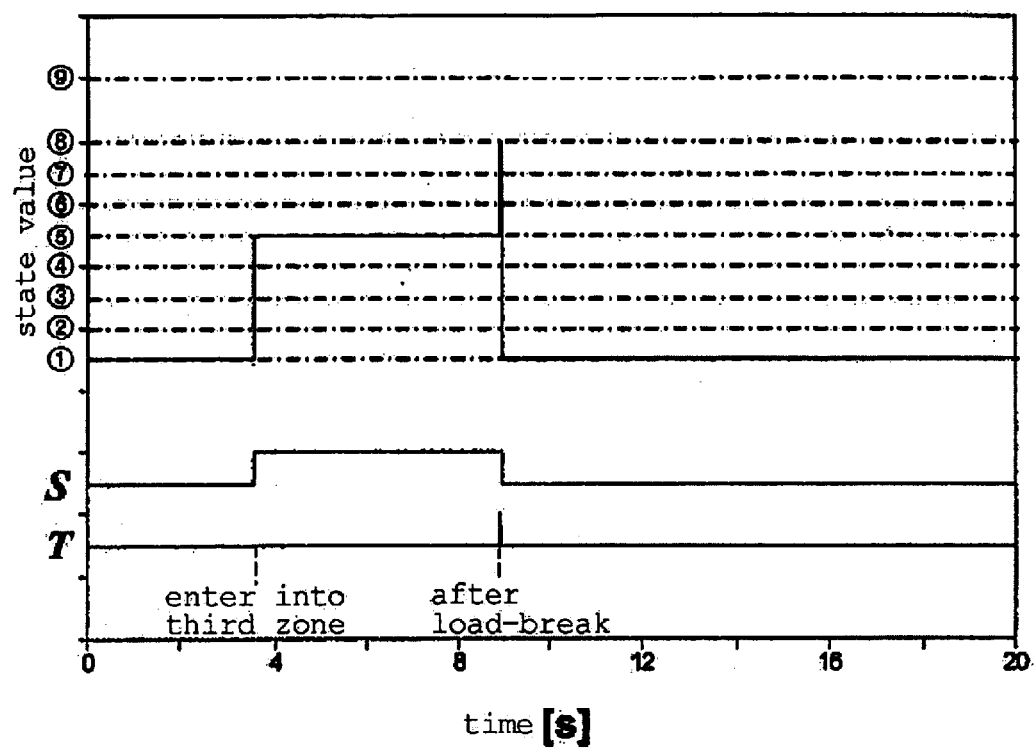
FIG. 12 is a view showing a state value and signals S and T under load-increase and load-break states according to one embodiment of the present invention.

FIG. 12 is a view showing a state value and signals S and T under load-increase and load-break states according to one embodiment of the present invention. When load applied to the second bus is increased, the entry confirmation signal S is "1" and the critical confirmation signal T is "0". Thus, the state transition of ①–⑤ occurs. In the load-break state, the state is shifted in the course of ⑤–⑥–⑧–⑦–① and returns to the initial state. Thus, the relay is prevented from being malfunctioned due to the load-interruption.

Figure 13:
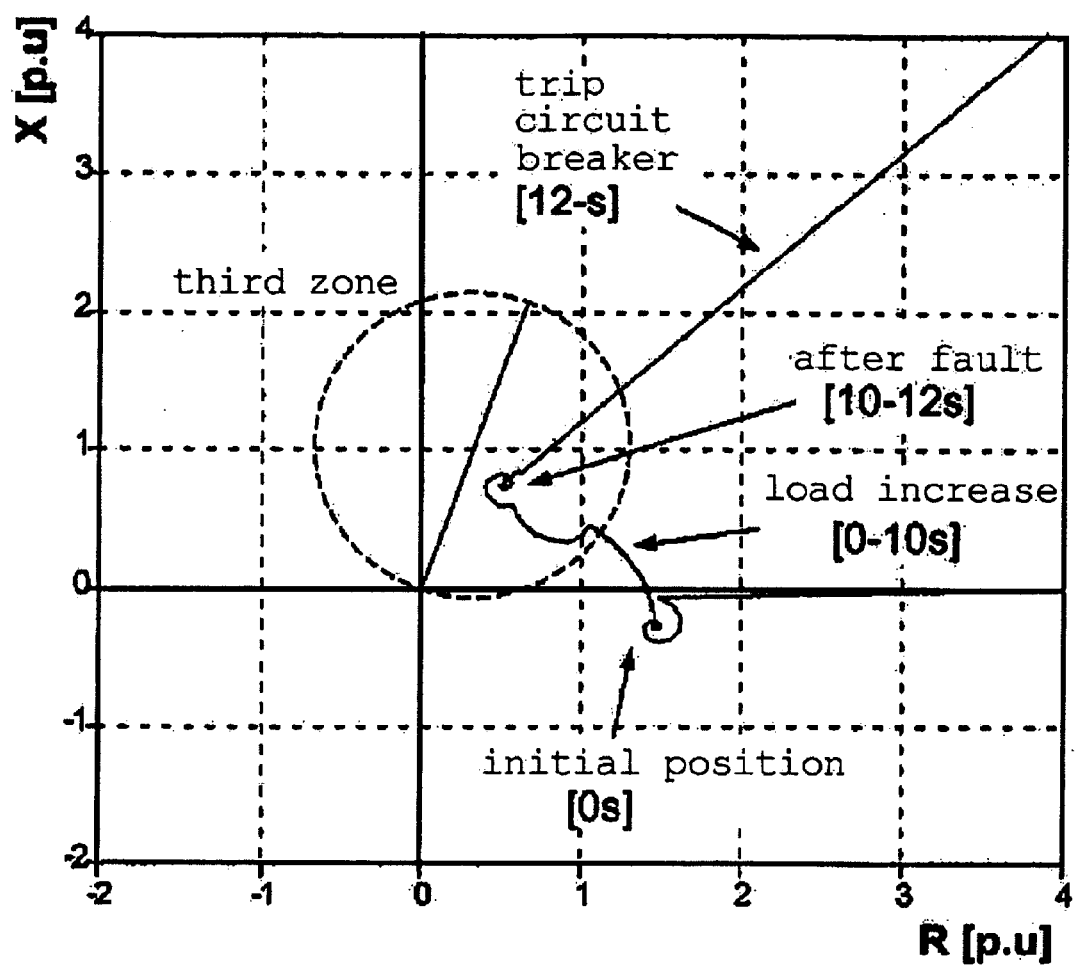
FIG. 13 is a view showing a path of apparent impedance in a heavy load state according to one embodiment of the present invention.

FIG. 13 is a view showing a path of apparent impedance in a heavy load state according to one embodiment of the present invention. If load applied to the second bus is increased, apparent impedance of the relay is gradually reduced and enters into the zone. At this time, the entry confirmation signal S of "1" is outputted. In addition, when the fault occurs, the entry confirmation signal S maintains "1".

Figure 14:
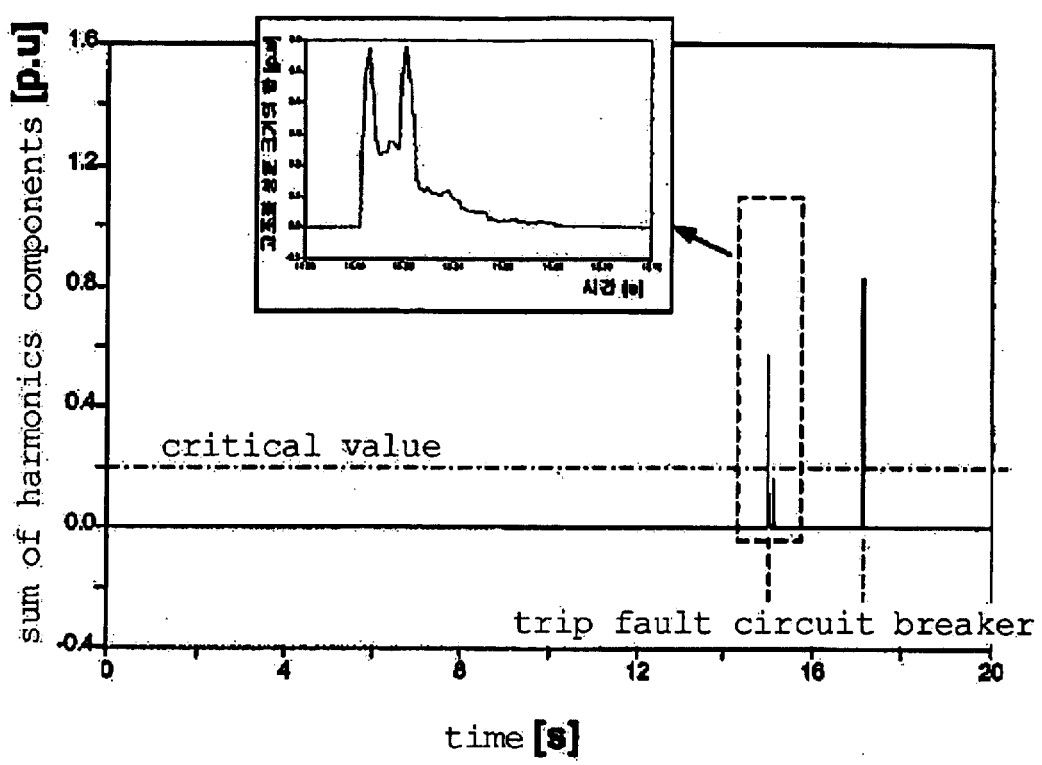
FIG. 14 is a view showing a sum of harmonics components in a heavy load state according to one embodiment of the present invention.

FIG. 14 is a view showing a sum of harmonics components in a heavy load state according to one embodiment of the present invention. When load applied to the second bus is increased, the sum of harmonics components of current in the relay is substantially zero, so the critical confirmation signal T is maintained in "0". However, when the fault occurs, the sum of harmonics components exceeds the critical value so that the critical confirmation signal T of "1" is outputted.

Figure 15:
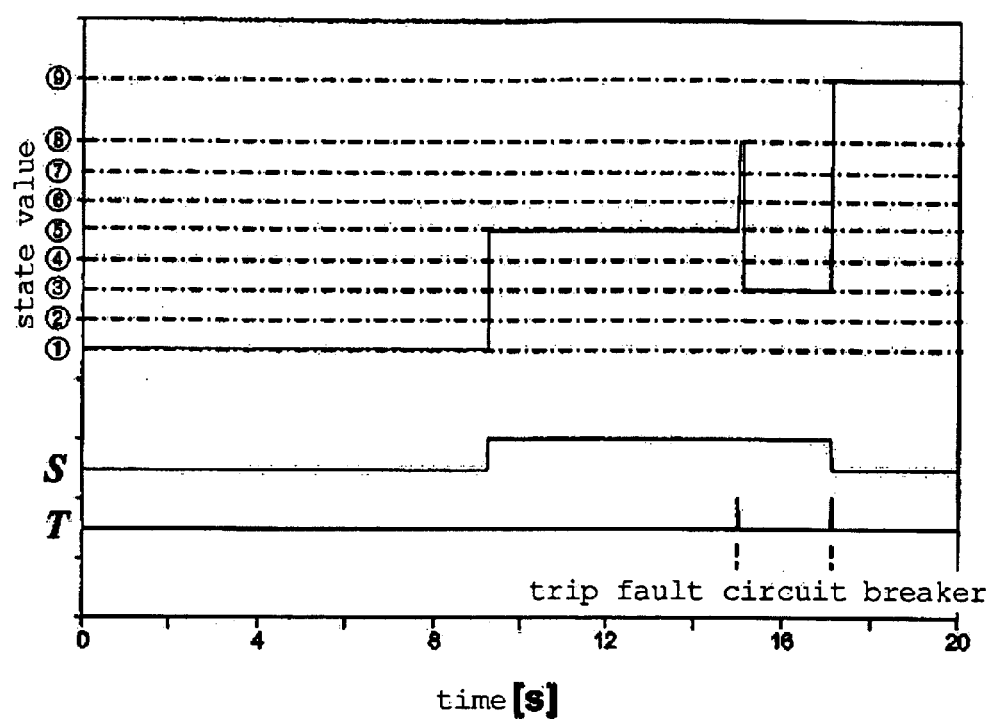
FIG. 15 is a view showing a state value and signals S and T in a heavy load state according to one embodiment of the present invention.

FIG. 15 is a view showing a state value and signals S and T in a heavy load state according to one embodiment of the present invention. When load applied to the second bus is increased, the entry confirmation signal S is "1" and the critical confirmation signal T is "0". Thus, the state transition of ①–⑤ occurs. At this time, if the fault occurs, the state is shifted in the course of ⑤–⑥–⑧–③, and is finally shifted into the circuit breaker trip state ⑨.

Accordingly, the relay is prevented from being malfunctioned even if load is increased and it is possible to precisely detect the fault under the heavy load state.

Figure 16:
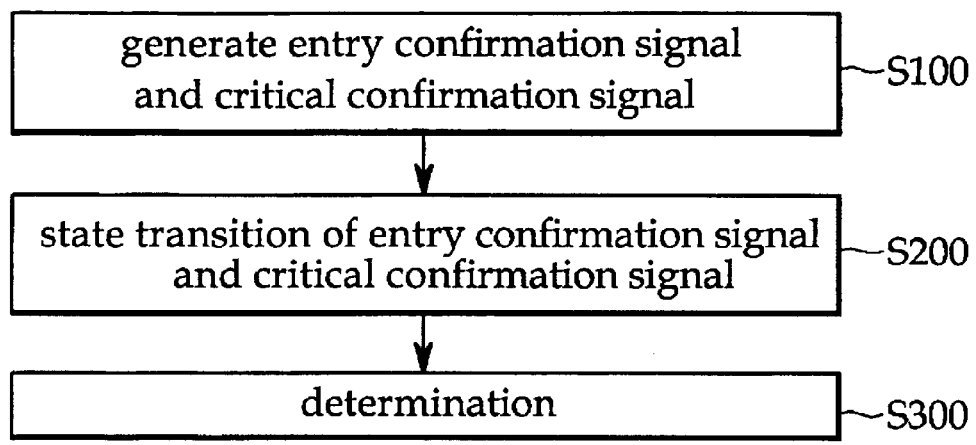
FIG. 16 is a block view showing a fault detecting method of the present invention.

FIG. 16 is a block view showing a fault detecting method of the present invention. Referring to FIG. 16, the fault detecting method of the present invention includes an entry confirmation signal and critical confirmation signal generating step, a state transition step of the entry confirmation signal and critical confirmation signal, and a determining step. In the entry confirmation signal and critical confirmation signal generating step, the entry confirmation signal S, which is a logic signal for notifying whether or not apparent impedance enters into the zone, is outputted from a transmission line by utilizing voltage and current of an electric power system and the sum of harmonics components of the transmission line is calculated so as to output the critical confirmation signal T, which is a logic signal for notifying whether or not the sum of harmonics components exceeds a predetermined critical value. In the state transition step of the entry confirmation signal and critical confirmation signal, the entry confirmation signal S and critical confirmation signal T are used as input parameters for a state transition diagram and a state transition is generated in the state transition diagram depending on variation of the entry confirmation signal S and critical confirmation signal T. In the determining step, the state of the electric power system is presumed by using the state value according to the entry confirmation signal S and critical confirmation signal T of the state transition diagram, thereby determining "fault", "no-fault", or "load-interruption".

Figure 17:
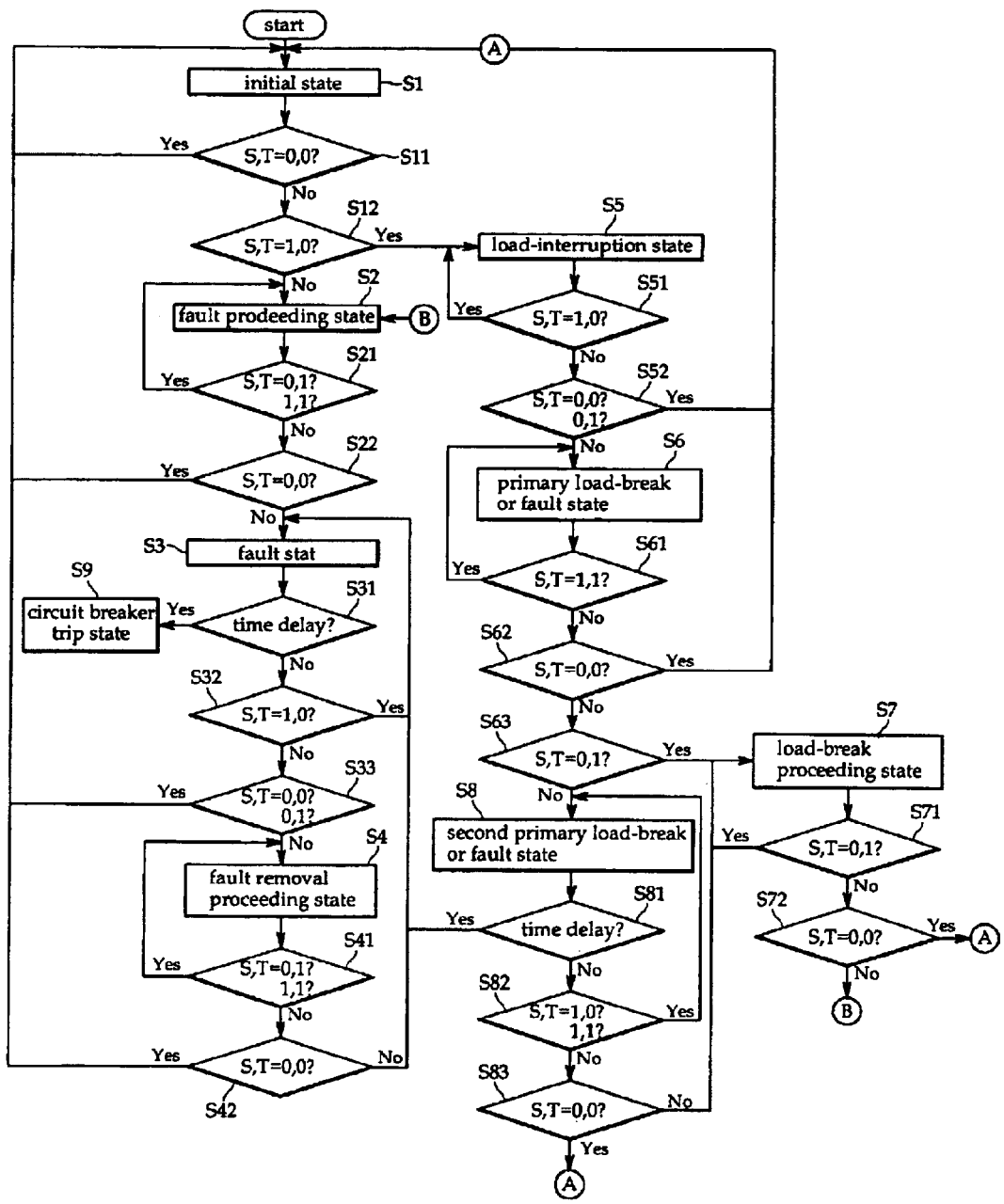
FIG. 17 is a flow chart showing a state transition of an entry confirmation signal and a critical confirmation signal.

FIG. 17 is a flow chart showing a state transition of the entry confirmation signal and the critical confirmation signal. In an initial state (S1), if the entry confirmation signal S (hereinafter, referred to signal S) and the critical confirmation signal T (hereinafter, referred to signal T) of FIG. 16 are not varied (S11), the present state is maintained. If only the signal S is varied into "1" (S12), that is, when apparent impedance enters into the third zone, the state is shifted into a load-interruption state (S5). In addition, when the signal T is shifted into "1" regardless of the signal S in step 12, that is, when the sum of harmonics components exceeds the critical value, the state is shifted into a fault proceeding state (S2).

After the state has been shifted into the fault proceeding state (S2), if the signal S and the signal T do not vary (S21), the present state is maintained. In addition, if the signal S and the signal T are varied into "0, 0" (S22), that is, in a case that apparent impedance does not enter into the third zone and the sum of harmonics components does not exceeds the critical value, the state is shifted into the initial state. If the signal S is shifted into "1" regardless of the signal T, that is, when apparent impedance enters into the third zone, the state is shifted into a fault state (S3).

If a predetermined time is delayed (S31) due to an operation of a timer after the state has been shifted into the fault state (S3), the state is shifted into a circuit breaker trip state (S9) for tripping a circuit breaker. When the time delay does not occur, and if the signal S and the signal T do not vary (S32), the present state is maintained. However, in a state that the signal S does not vary, if the signal T is not varied or varied into "1" (S33), that is, when the sum of harmonics components exceeds the critical value, the state is shifted into the initial state (S1). In addition, if the signal S and signal T are varied into "1, 1" in step 33, that is, when apparent impedance enters into the third zone and the sum of harmonics components exceeds the critical value, the state is shifted into a fault removing state (S4).

After the state has been shifted into the fault removing state (S4), if there are no variations in the signal T and the signal S (S41), the present state is maintained. However, if the signal S and the signal T are varied into "0, 0" (S42), that is, when apparent impedance does not enter into the third zone and the sum of harmonics components does not exceed the critical value, the state is shifted into the initial state. In addition, if the signal S and the signal T are varied into "1, 0", that is, when apparent impedance enters into the third zone and the sum of harmonics components does not exceed the critical value, the state is shifted into the fault state (S3).

In addition, when the state has been shifted into the load-interruption state (S5), the present state is maintained if there are no variations in the signal S and the signal T (S51). However, if the signal S and the signal T are varied into "0, 0" or "0, 1" (S52), that is, when apparent impedance does not enter into the third zone and the sum of harmonics components does not exceed the critical value, or when apparent impedance does not enter into the third zone and the sum of harmonics components exceeds the critical value, the state is shifted into the initial state (S1). In addition, the signal S and the signal T are varied into "1, 1" in step 52, that is, when apparent impedance enters into the third zone and the sum of harmonics components exceeds the critical value, the state is shifted into a primary load-break or fault state (S6).

After the state has been shifted into the primary load-break or fault state (S6), the present state is maintained if there are no variations in the signal S and the signal T (S61). However, if the signal S and the signal T are varied into "0, 0" (S62), that is, when apparent impedance does not enter into the third zone and the sum of harmonics components does not exceed the critical value, the state is shifted into the initial state. In addition, if the signal S and the signal T are varied into "0, 1" (S63), that is, when apparent impedance does not enter into the third zone and the sum of harmonics components exceeds the critical value, the state is shifted into a load-break proceeding state (S7). If the signal S and the signal T are varied into "1, 0" in step 63, that is, when apparent impedance enters into the third zone and the sum of harmonics components does not exceed the critical value, the state is shifted into a secondary load-break or fault state (S8).

If a predetermined time is delayed (S81) due to an operation of a timer after the state has been shifted into the secondary load-break or fault state (S8), the state is shifted into the fault state (S3). In addition, if the signal S and the signal T are varied into "1, 0" or "1, 1" in step 82, that is, when apparent impedance enters into the third zone and the sum of harmonics components does not exceed the critical value, or when apparent impedance enters into the third zone and the sum of harmonics components exceeds the critical value, the present state is maintained. If the signal S and the signal T are varied into "1, 0" or "1, 1" in step 82, that is, when apparent impedance does not enter into the third zone and the sum of harmonics components does not exceed the critical value, the state is shifted into the secondary load-break or fault state (S8). Otherwise, the state is returned to the initial state (S1).

In addition, after the state has been shifted into the load-break proceeding state (S7), the present state is maintained if there are no variations in the signal S and the signal T (S71). If the signal S and the signal T are varied into "0, 0" (S72), that is, when apparent impedance does not enter into the third zone and the sum of harmonics components does not exceed the critical value, the state is shifted into the initial state (S1). If only the signal S is varied into "0" in step 72, that is, when apparent impedance does not enter into the third zone, the state is shifted into the fault proceeding state (S2).

As described above, according to the method for detecting the fault on the transmission line by using harmonics and the state transition diagram, the state of the electric power system is presumed by utilizing harmonics and apparent impedance, thereby detecting the fault on the transmission line. Thus, the distance relay is prevented from being malfunctioned so that a reliable operation of the distance relay is ensured.

In addition, according to the present invention, it is possible to presume the state transition of the present system in addition to the fault of the transmission line by using the state transition diagram. Particularly, since the present invention uses harmonics, which is a multiple of basic frequency, the method of the present invention can be easily achieved by simply changing software without correcting hardware.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for detecting a fault on a transmission line by using harmonics and a state transition diagram, the method comprising the steps of:

i) generating an entry confirmation signal and a critical confirmation signal, in which the entry confirmation signal, which is a signal for notifying whether or not a path of apparent impedance enters into a zone, is outputted from a transmission line by utilizing voltage and current of an electric power system and a sum of harmonics components of the transmission line is calculated so as to output the critical confirmation signal, which is a signal for notifying whether or not the sum of harmonics components exceeds a predetermined critical value;

ii) applying the entry confirmation signal and the critical confirmation signal to a state transition diagram in order to make a state transition depending on variation of the entry confirmation signal and the critical confirmation signal; and iii) presuming a state of the electric power system by analyzing the state transition in the state transition diagram according to variation of the entry confirmation signal and the critical confirmation signal, thereby determining a fault, no-fault state, and a load-interruption state, in which apparent impedance enters into the zone due to an increase of load.

2. The method as claimed in claim 1, wherein the critical confirmation signal is calculated according to following equations:

$$H_{sum} = \sum_{k=2}^{N/2} |X(k)|$$

$$X(n) = \sum_{k=0}^{N-1} x_k W_N^{nk}$$

$$= \sum_{k=0}^{N-1} x_k \cos\left(\frac{2\pi nk}{N}\right) - j\sum_{k=0}^{N-1} x_k \sin\left(\frac{2\pi nk}{N}\right) \quad (n = 0, 1, 2, \ldots, N-1)$$

wherein, $W_N = e^{-j(2\pi/N)}$, $X_k = x[t-(N-1)+k]$, $X(n)$ is harmonics component, and $H_{sum}$ is a sum of harmonics components.

3. The method as claimed in claim 1, wherein step ii) includes the substeps of:

a) shifting into a load-interruption state when apparent impedance enters into a third zone as load increases in relation to an input of the entry confirmation signal and the critical confirmation signal in an initial state, and shifting into a fault proceeding state when the sum of harmonics components exceeds the critical value;

b) maintaining a present state if the entry confirmation signal and the critical confirmation signal are not varied after the state has been shifted into the fault proceeding state, shifting into the initial state if apparent impedance is out of the third zone or the sum of harmonics components becomes lower than the critical value due to a decrease of load, and shifting into a fault state when the sum of harmonics components exceeds the critical value and apparent impedance enters into the third zone due to increase of load;

c) shifting into a circuit breaker trip state for tripping a circuit breaker if a predetermined time is delayed after the state has been shifted into the fault state, maintaining the present state if the entry confirmation signal and the critical confirmation signal are not varied, shifting into the initial state if apparent impedance is out of the third zone due to the decrease of load, and shifting into a fault removing state if the sum of harmonics components exceeds the critical value when load has been increased; and d) maintaining the present state if the entry confirmation signal and the critical confirmation signal are not varied after the state has been shifted into the fault removing state, and shifting into the fault state if apparent impedance enters into the third zone and the sum of harmonics components becomes lower than the critical value.

4. The method as claimed in claim 3, further comprising the substeps of:

e) maintaining the present state if the entry confirmation signal and the critical confirmation signal are not varied, shifting into the initial state if apparent impedance is out of the third zone due to the decrease of load, and shifting into a primary load-break and fault state when apparent impedance enters into the third zone due to the increase of load and the sum of harmonics components exceeds the critical value;

f) maintaining the present state if the entry confirmation signal and the critical confirmation signal are not varied after the state has been shifted into the primary load-break or fault state, shifting into the initial state when apparent impedance is out of the third zone due to the decrease of load and the sum of harmonics components becomes lower than the critical value, and selectively shifting into a load-break proceeding state or a secondary load-break or fault state when load is creased; and g) shifting into the fault state due to a time delay after the state has been shifted into the secondary load-break or fault state, maintaining the present state if the entry confirmation signal and the critical confirmation signal are not varied, and shifting into a load-break proceeding state if apparent impedance is out of the third zone due to the decrease of load and the sum of the harmonics components exceeds the critical value.

5. The method as claimed in claim 4, further comprising the substeps of maintaining the present state if the entry confirmation signal and the critical confirmation signal are not varied, shifting into the initial state if apparent impedance is out of the third zone due to the decrease of load and the sum of the harmonics components becomes lower than the critical value, and shifting into the fault proceeding state when increased load is continuously maintained.

6. The method as claimed in claim 5, wherein, in step iii), when a state transition procedure according to the entry confirmation signal and the critical confirmation signal is carried out in a course of the initial state, the fault proceeding state, the fault state, and the circuit break trip state, it is determined that the circuit breaker is tripped under a condition that apparent impedance enters into the third zone of a distance relay while causing the fault and the fault is not removed due to a time delay.

7. The method as claimed in claim 5, wherein, in step iii), when a state transition procedure according to the entry confirmation signal and the critical confirmation signal is carried out in a course of the initial state, the fault proceeding state, the fault state, the fault removing state, the initial state, or in a course of the initial state, the fault proceeding state, the fault state, and the initial state, it is determined that the fault is removed by means of a main protection under a condition that apparent impedance enters into the third zone of a distance relay, thereby occurring the fault.

8. The method as claimed in claim 5, wherein, in step iii), when a state transition procedure according to the entry confirmation signal and the critical confirmation signal is carried out in a course of the initial state, the load-interruption state, and the initial state, it is determined that apparent impedance entered into the third zone of the distance relay while increasing load is out of the third zone of the distance relay so that load is decreased.

9. The method as claimed in claim 5, wherein, in step iii), when a state transition procedure according to the entry confirmation signal and the critical confirmation signal is carried out in a course of the initial state, the load-interruption state, the primary load-break or fault state, the secondary load-break or fault state, and the initial state, it is determined that load is shut off after the fault occurs in a state that apparent impedance enters into the third zone of the distance relay.

10. The method as claimed in claim 5, wherein, in step iii), when a state transition procedure according to the entry confirmation signal and the critical confirmation signal is carried out in a course of the initial state, the load-interruption state, the primary load-break or fault state, the secondary load-break or fault state, the fault state, and the circuit break trip state, it is determined that the circuit breaker is tripped under a condition that apparent impedance enters into the third zone of a distance relay while increasing load and causing the fault and the fault is not removed due to a time delay.

11. The method as claimed in claim 5, wherein, in step iii), when a state transition procedure according to the entry confirmation signal and the critical confirmation signal is carried out in a course of the initial state, the fault proceeding state, and the initial state, it is determined that the load is shut off when the fault occurs.

* * * * *